(12) United States Patent
Ko et al.

(10) Patent No.: US 12,712,035 B2
(45) Date of Patent: Aug. 18, 2026

(54) PREDICTIVE PROGRAM VERIFICATION

(71) Applicant: Micron Technology, Inc., Boise, ID (US)

(72) Inventors: Jungmi Ko, Santa Clara, CA (US); Junghwan Lee, Cupertino, CA (US); Byungkwan Jeong, San Jose, CA (US); Kwangho Baek, Sunnyvale, CA (US); Seong Je Park, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 27 days.

(21) Appl. No.: 18/785,866

(22) Filed: Jul. 26, 2024

(65) Prior Publication Data

US 2025/0069676 A1 Feb. 27, 2025

Related U.S. Application Data

(60) Provisional application No. 63/534,425, filed on Aug. 24, 2023.

(51) Int. Cl.

| | |
|---|---|
| ***G11C 16/24*** | (2006.01) |
| ***G11C 16/10*** | (2006.01) |
| ***G11C 16/34*** | (2006.01) |

(52) U.S. Cl.

CPC ........ *G11C 16/3459* (2013.01); *G11C 16/102* (2013.01); *G11C 16/24* (2013.01)

(58) Field of Classification Search

CPC ... G11C 16/3459; G11C 16/102; G11C 16/24; G11C 11/5628; G11C 16/0483; G11C 16/10

See application file for complete search history.

(56) References Cited

U.S. PATENT DOCUMENTS

2024/0038315 A1* 2/2024 Song .................. G11C 16/3454

* cited by examiner

*Primary Examiner* — Xiaochun L Chen

(74) *Attorney, Agent, or Firm* — Lowenstein Sandler LLP

(57) ABSTRACT

A memory array comprises a plurality of memory cells. Control logic coupled to the memory array can cause a program voltage to be applied to a subset of the plurality of memory cells to be programmed to a specified logical level, where the specified logical level is associated with a group of logical levels. The control logic can cause a first program verify voltage associated with the group of logical levels to be applied to the memory cells. The control logic can decrement a count associated with the group of logical levels, where the count indicates a number of remaining program voltages to be applied for programming the subset of memory cells to a logical level of the predefined group of logical levels and terminate the program operation for the subset of plurality of memory cells responsive to determine that the count falls below a threshold value.

17 Claims, 7 Drawing Sheets

500

Cause a program voltage to be applied to a subset of the plurality of memory cells to be programmed to a specified logical level during a program operation, wherein the specified logical level is associated with a group of logical levels 505

Cause a first program verify voltage associated with the group of logical levels to be applied to the subset of memory cells 510

Decrement a count associated with the specified logical level, wherein the count indicates a number of remaining program voltages to be applied for programming the subset of memory cells to the specified logical level of the predefined group of logical levels 515

Responsive to determining that the count falls below a threshold value, terminating the program operation for the subset of the plurality of memory cells 520

500

Cause a program voltage to be applied to a subset of the plurality of memory cells to be programmed to a specified logical level during a program operation, wherein the specified logical level is associated with a group of logical levels 505

Cause a first program verify voltage associated with the group of logical levels to be applied to the subset of memory cells 510

Decrement a count associated with the specified logical level, wherein the count indicates a number of remaining program voltages to be applied for programming the subset of memory cells to the specified logical level of the predefined group of logical levels 515

Responsive to determining that the count falls below a threshold value, terminating the program operation for the subset of the plurality of memory cells 520

FIG. 5

PREDICTIVE PROGRAM VERIFICATION

REFERENCE TO RELATED APPLICATIONS

This application claims the priority benefit of U.S. Provisional Application No. 63/534,425, filed Aug. 24, 2023, which is incorporated by reference herein.

TECHNICAL FIELD

Embodiments of the disclosure relate generally to memory sub-systems, and more specifically, relate to an improved predictive program verification operation.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 5 is a flow diagram of an example method utilized in improved systems including a program verify operation using arithmetic algorithm, in accordance with some embodiments of the present disclosure.

DETAILED DESCRIPTION

Figure 1A:
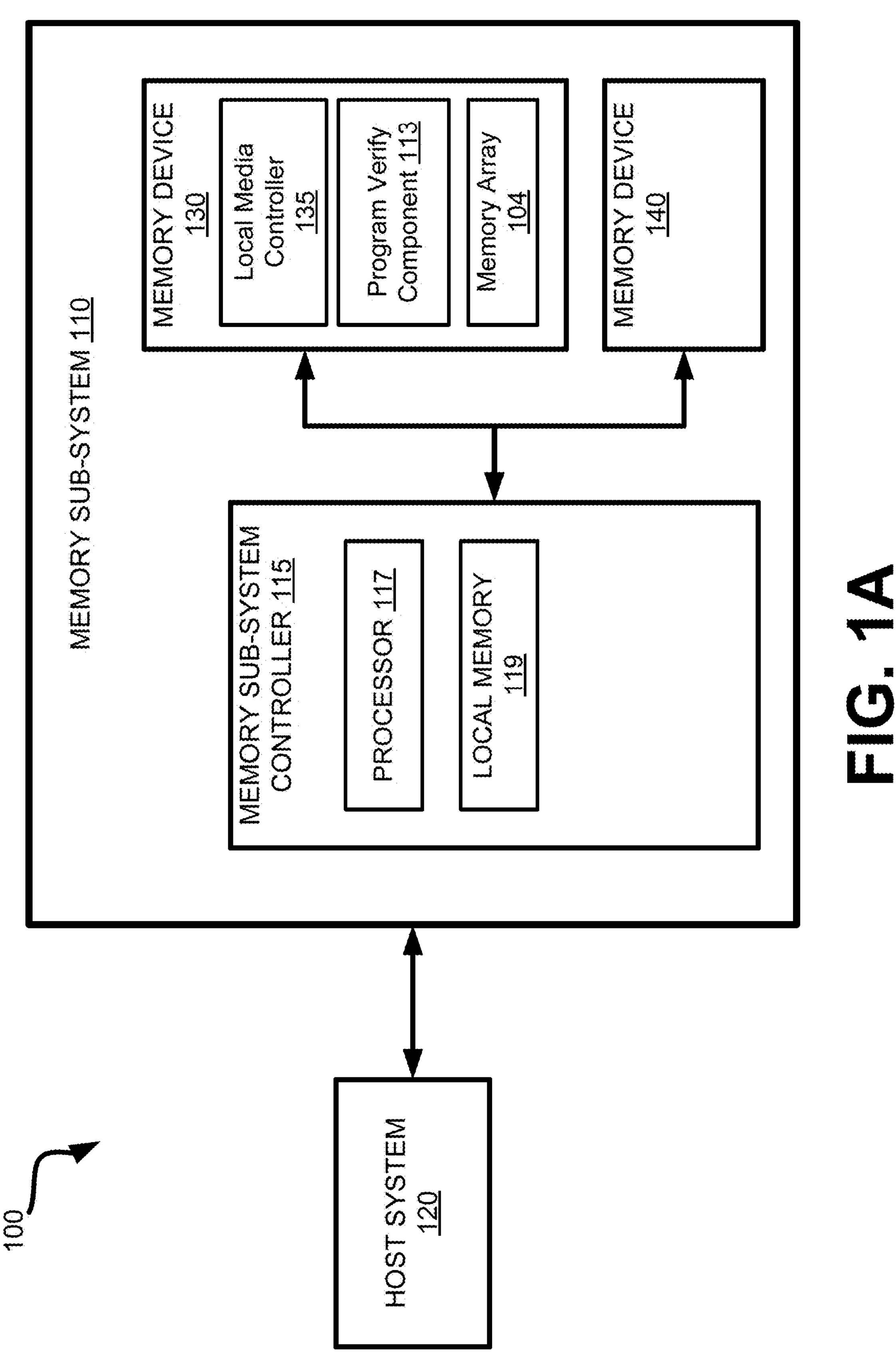
FIG. 1A illustrates an example computing system that includes a memory sub-system in accordance with some embodiments of the present disclosure.

Aspects of the present disclosure are directed to an improved predictive program verification operation. In particular, aspects of the present disclosure are directed to decreasing the number of program verify pulses applied during the program verify operation compared with other solutions. A memory sub-system can be a storage device, a memory module, or a combination of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes a set of physical blocks. Each block includes a set of pages. Each page includes a set of memory cells ("cells"). A cell is an electronic circuit that stores information. Depending on the cell type, a cell can store one or more bits of binary information, and has various logical levels that correlate to the number of bits being stored. The logical levels can be represented by binary values, such as "0" and "1", or combinations of such values.

A memory device can include multiple memory cells arranged in a two-dimensional or a three-dimensional grid. The memory cells can be formed on a silicon wafer in an array of columns and rows. A wordline can refer to a conductive line coupled to memory cells that are used with one or more bitlines to generate the address of each of the memory cells. The intersection of a bitline and wordline constitutes the address of the memory cell. A block hereinafter refers to a unit of the memory device used to store data and can include a group of memory cells. One or more blocks can be grouped together to form separate partitions (e.g., planes) of the memory device in order to allow concurrent operations to take place on each plane. Each data block can include a number of sub-blocks, where each sub-block is defined by an associated pillar (e.g., a vertical conductive trace) extending from a shared bitline. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of channel material. The memory cells can be coupled to access lines, which are commonly referred to as "wordlines," often fabricated in common with the memory cells, so as to form an array of strings in a block of memory. The compact nature of certain non-volatile memory devices, such as 3D flash NAND memory, means wordlines are common to many memory cells within a block of memory.

During a program operation on a non-volatile memory device, certain phases can be executed, including program, program recovery, program verify, and program verify recovery. During a programming operation, a selected set of memory cells can be programmed by applying a programming voltage to one or more wordline. A high program voltage can be applied during a program phase, followed by a program recovery phase where the nodes are discharged. Then a verify voltage can be applied during a program verify phase, followed by a verify recovery phase. During the recovery phases all signals on wordlines are ramped down to some lower voltage level.

In order to satisfy various operational and data reliability requirements, threshold voltage distributions (e.g., a distribution of threshold voltages of a group of memory cell that have been programmed to a same logical level) of programmed memory cells should conform to certain parameters, such as distribution width (e.g., the difference between the maximum and minimum threshold voltage of a group of memory cells that have been programmed to a same logical level). Furthermore, triple-level cell (TLC) and quad-level cell (QLC) memory device have a higher number of logical level (e.g., eight (8) and sixteen (16) respectively) and impose more stringent requirement to the width of the threshold voltage distributions.

During a programming operation, control logic can apply a series of incrementally increasing programming pulses to a control gate of a memory cell being programmed to gradually increase the memory cell charge level. A program verify operation can be performed after each programming pulse is applied. The program verify operation can determine a threshold voltage of the memory cell resulting from the application of the programming pulse. In some examples, the program verify operation can include storing a target threshold voltage in a page buffer (e.g., a target threshold voltage associated with a target logical level the memory cell is to be programmed to) that is coupled to each bitline. The program verify operation can cause an application of a series of ramped voltages to the control gate of the memory cell being verified. When a ramped voltage of the series of ramped voltages reaches the threshold voltage of the programmed memory cell, the memory cell turns on and sense circuitry detects a current on the bitline coupled to the memory cell. Accordingly, the sense circuitry can compare a current threshold voltage of the memory cell to the stored target threshold voltage. If the present threshold voltage is greater than or equal to the target threshold voltage, no further programming pulses need to be applied.

As some solutions apply the ramped voltage during the program verify operation subsequent to each program pulse being applied, the program verify operation can be time consuming. The program verify operation can take longer as a number of bits stored by a memory cell increase—e.g., a program verify operation can take longer on a quad-level cell (QLC) than a program verify operation on a triple-level cell (TLC). For example a program verify operation on a QLC memory cell can utilize multiple ramped voltages after each program pulse is applied. A program time can be a time a memory device utilizes to execute a program operation. This can include a time the non-voltage device takes to execute the program verify operation. Accordingly, the program time can be time consuming due to the time consuming program verify operation.

Aspects of the present disclosure address the above and other deficiencies by implementing a program verify operation that utilizes a predictive algorithm to reduce a number of program verify pulses applied. For example, a local media controller of a memory array can use a single program verify level voltage for a group of logical levels. The controller can group the logical levels into any number of groups based on a program voltage step (e.g., Vpgm step), memory array size, a number of bits stored by the memory cell, the number of program pulses applied, a read window budget (RWB), etc. The controller can select a lowest program verify voltage level associated with each group determined—e.g., select a group verify voltage for each group determined. Additionally, the memory device can store in a page buffer coupled to a bitline associated with the program operation (e.g., associated with memory cells selected for the program operation) the number of program pulses remaining to be applied for programming the memory cells to a specified logical level. For example, the controller can group the logical levels such that a group of the selected groups includes four (4) logical levels.

In one example, the controller can initiate a program operation to program memory cells to one of sixteen logical levels—e.g., to one of sixteen voltage threshold distributions. In one example, the controller can determine to group the logical levels into four (4) groups of logical levels, each group including four (4) logical levels—e.g., logical levels associated with logical levels '0000', '0001', '0010' and '0011' can be in a first logical levels group, logical levels associated with logical levels '0100', '0101', 0110', '0111' can be in a second logical levels group, and so forth. Accordingly, the controller can begin the program operation by programming memory cells to a first logic level associated of the first group of logical levels. After causing a programming pulse associated with programming memory cells to the first logic levels to be applied, the controller can cause a program verify pulse to be applied. In some embodiments, the program verify pulse can be the group verify voltage determined for the first group—e.g., the controller can cause a first group verify voltage to be applied. In addition to causing the application of the program pulse and the first group verify voltage to be applied, the controller can also decrement a count associated with each logical levels of the first group of logical levels.

For example, the memory device stores information regarding a sequence of the program operation (e.g., the memory device can store code that indicates a sequence to perform during the program operation). The programming sequence can indicate the number of programming pulses applied to program memory cells to respective logic level—e.g., one (1) program pulse to program memory cells to the first logic level, two (2) program pulses to program memory cells to a second logic level, three (3) program pules to program memory cells to a third logic level, four (4) program pulses to program memory cells to a fourth logic level, etc. Based on this information, the controller can determine the number of program pulses still to be applied to program memory cells to a respective logic level. For example, the controller can determine after applying the programming pulse and the first group verify voltage, the controller can apply a second programming pulse to program memory cells to the second logical level (associated with the second threshold voltage distribution), a third programming pulse to program memory cells to the third logical level (associated with the third threshold voltage distribution), and a fourth programming pulse to program memory cells to the fourth logical level (associated with the fourth threshold voltage distribution). Accordingly, the controller can determine there is one (1) remaining program pulse to program memory cells to the second logical level, two (2) remaining program pulses to program memory cells to the third logical level, and three (3) remaining program pulses to program memory cells to the fourth logical level. The memory device can store the respective counts (e.g., a count of one (1) for the second threshold voltage distribution, a count of two (2) for the third threshold voltage distribution, etc., at the page buffer coupled to the bitline. The controller can decrement each respective count by one (1) following subsequent programming pulses—e.g., the controller can track the number of program pulses remaining for memory cells to be programmed to a respective voltage threshold distribution.

For example, the controller can cause a second programming pulse to be applied and cause the first group verify voltage to be applied again after the second programming pulse. After applying the first group verify voltage for the second time, the controller can decrement the respective count for each threshold voltage distribution—e.g., decrement the count associated with the second threshold voltage distribution to zero, decrement the count associated with the third threshold voltage distribution to one (1), and so forth. In at least one embodiment, the controller can stop further programming of memory cells when their respective voltage threshold distribution count is at zero—e.g., stop programming memory cells that are to be programmed to the second voltage threshold distribution when the count associated with the second threshold voltage distribution is zero. The controller can continue to cause program pulses and the first group verify voltage to be applied until each respective count of each threshold voltage distributions of the first group of threshold voltage distributions is zero (0). In such example, the controller can then proceed to program memory cells to the second group of threshold voltage distributions in a similar fashion.

By implementing the improved predictive program verification operation, the memory device can reduce a number of program verify pulses applied. This can reduce overall power consumption of the system as well as reduce the overall programming time.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory device 130 includes a program verify component 113 that can manage the program verify operation on a non-volatile memory device, such as memory device 130, of memory sub-system 110. For example, program verify component 113 can store information regarding a number of logical levels and a respective group verify voltage for each group of logical levels. The program verify component 113 can also store the number of program pulses that are remaining to program a memory cell to a logical level—e.g., a number of programming pulses that to are to be applied to memory cells to program them to the respective logical level after applying the first group verify voltage for each logical level in a respective group. The number of remaining program pulse can be referred to as a count—e.g., each respective logical level can have a corresponding count. The program verify component 113 can predict when memory cells will have been programmed to a specified logical level based on updating the count for each respective logical level—e.g., predict memory cells have been programmed when the respective count is zero (0) indicating no additional programming pulses should be applied. For example, the program verify component 113 can apply a first program pulse and a first group verify level voltage. The program verify component 113 can decrement a count (e.g., the number of program pulses remaining after applying the first group verify voltage) associated with each respective logical level distribution and stop further programming of memory cells to a logical level associated a count zero (0). In one embodiment, the program verify component 113 can continue this operation until all groups are programmed. For example, the program verify component 113 can store information that indicates a group includes two (2) or more logical levels. The program verify component 113 can also store information that indicates zero (0) program pulses remain after the first group verify voltage for a first logical level and one (1) program pulse remains after the first group verify voltage for a second logical level. Accordingly, the program verify component 113 can stop further programming of memory cells to be programmed to the first logical level after the first group verify voltage is applied. The program verify component 113 can then apply a second program voltage and the group verify level a second time and decrement the count associated with the second logical level—e.g., decrement the count to zero (0) after applying the second programming pulse. Accordingly, the program verify component 113 can stop programming of memory cells to be programmed to the second logical level after the count is zero (0).

In some embodiments, the memory sub-system controller 115 includes at least a portion of program verify component 113. For example, the memory sub-system controller 115 can include a processor 117 (e.g., a processing device) configured to execute instructions stored in local memory 119 for performing the operations described herein. In some embodiments, program verify component 113 is part of the host system 110, an application, or an operating system. In other embodiment, local media controller 135 includes at least a portion of program verify component 113 and is configured to perform the functionality described herein. In such an embodiment, program verify component 113 can be implemented using hardware or as firmware, stored on memory device 130, executed by the control logic (e.g., program verify component 113) to perform the operations related to program recovery described herein.

Figure 1B:
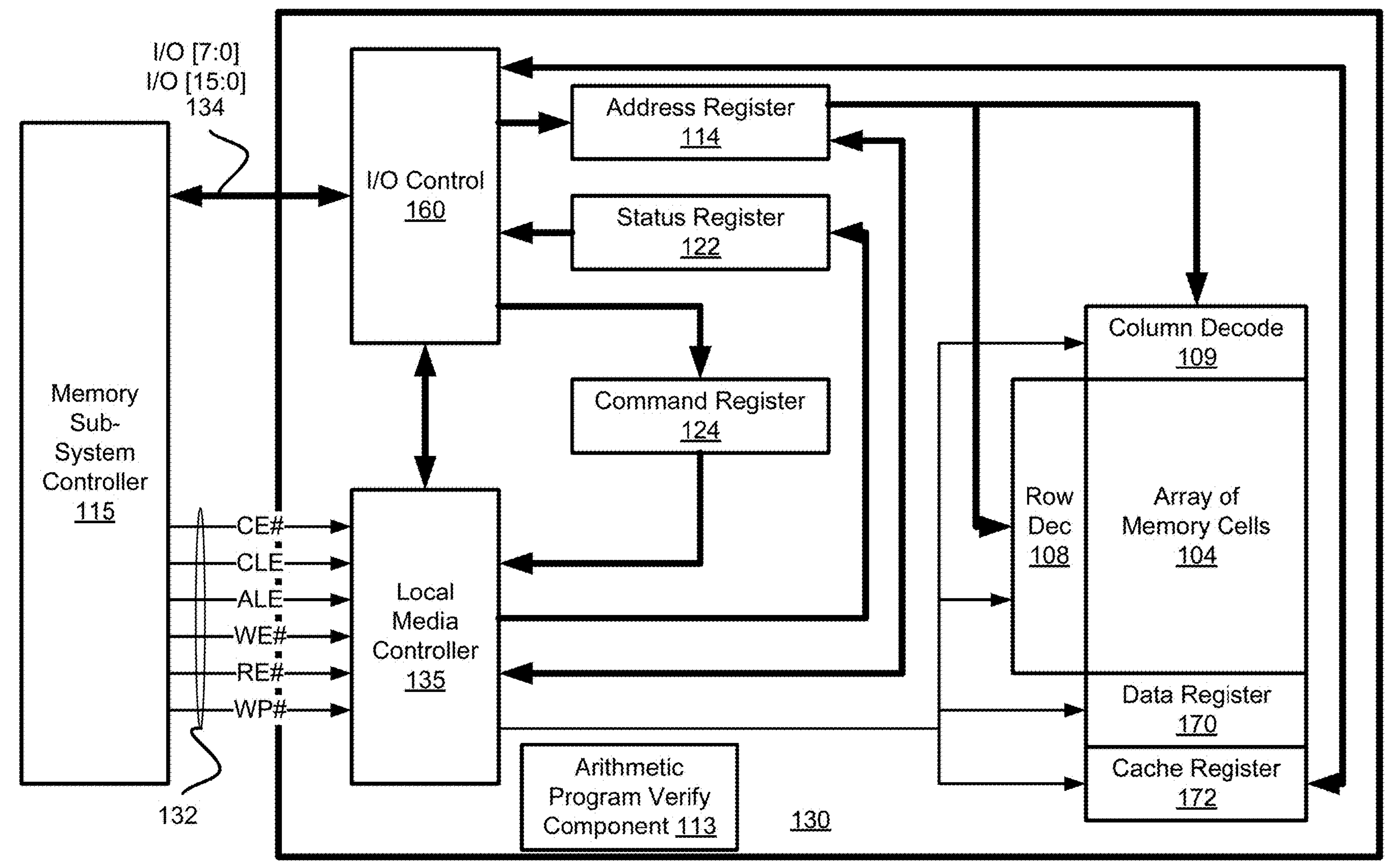
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device. The memory device 130 can include the program verify component 113 as described with reference to FIG. 1A.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states. In one embodiment, the array of memory cells 104 (i.e., a "memory array") can include a number of sacrificial memory cells used to detect the occurrence of read disturb in memory device 130, as described in detail herein.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 160 and may then be written into command register 124. The addresses may be received over input/output (I/O) pins [7:0] of I/O bus 236 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
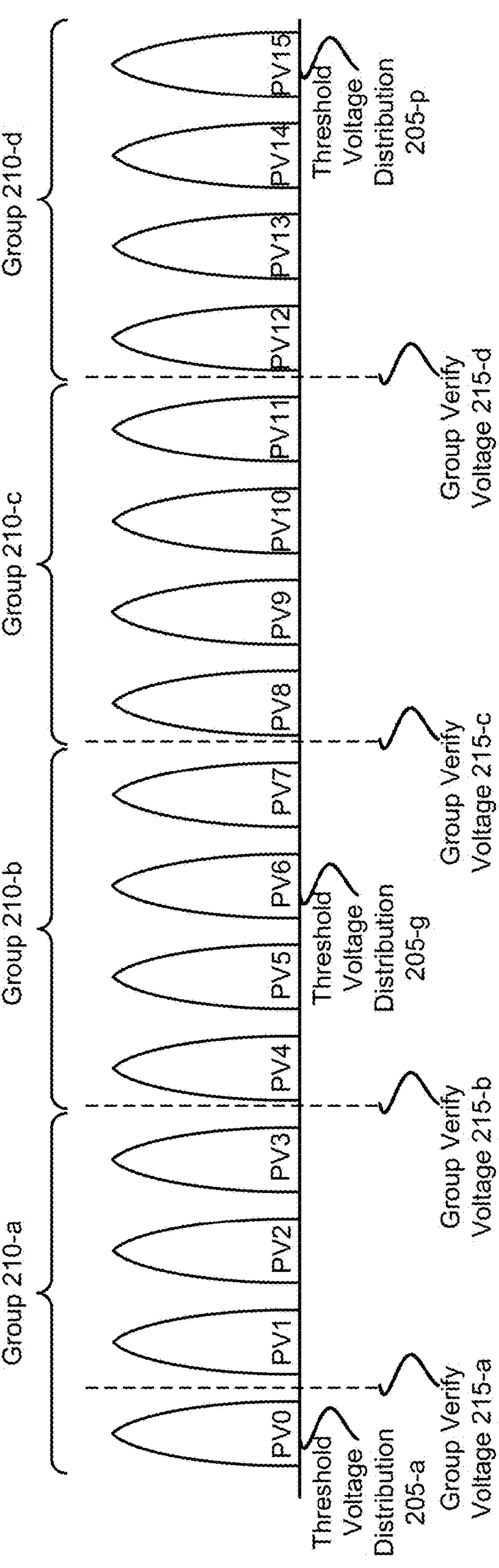
FIG. 2 is a diagram illustrating voltage threshold distribution grouping, in accordance with some embodiments of the present disclosure.

FIG. 2 illustrates a diagram 200 utilizing an improved predictive program verification operation, in accordance with some embodiments of the present disclosure. In one embodiment, diagram 200 can illustrate one possible grouping of threshold voltage distributions (e.g., distributions associated with a particular program verify (PV) voltage) associated with a specified logical level. It should be noted a number of threshold voltage distributions shown and/or a number of groups shown in diagram 200 are for illustrative purposes only and one example of many possible. That is, diagram 200 could illustrate any number of threshold voltage distributions (e.g., two (2), four (4), eight (8), sixteen (16), thirty-two (32), etc.) and any number of groups 210 (e.g., two (2) groups, three (3) groups, four (4) groups, five (5) groups, six (6) groups, seven (7) groups, eight (8) groups, etc.). In some embodiments, diagram 200 can illustrate threshold voltage associated with a quadruple-level cell (QLC). In other embodiments, diagram 200 could illustrate threshold voltage distributions of multi-level cells (MLC), triple-level cells (TLC), penta-level cells (PLC), etc. In this embodiment, diagram 200 illustrates sixteen threshold voltage distributions (e.g., threshold voltage distribution 205-*a* through 205-*p*), four (4) groups 210 (e.g., groups 210-*a* through 210-*d*), with each group 210 having a respective group verify voltage 215.

In one embodiment, control logic of a memory device (e.g., memory device 130 as described with reference to FIG. 1A) can group specified voltage levels (e.g., their respective threshold voltage distributions) into groups 210. In some embodiment, the control logic can place the logical levels (e.g., the respective threshold voltage distributions) into groups based on a program voltage step (e.g., Vpgm step), memory array size, a number of bits stored by the memory cell, the number of program pulses applied, a read window budget (RWB), etc.—e.g., the memory device can have a larger number of groups to increase a read window budget or a smaller number of groups based on a memory cell storing four (4) bits. In the example illustrated in diagram 200, the control logic can select four (4) groups, each group having four (4) threshold voltage distributions. For example, group 210-*a* can include logical levels associated with threshold voltage distribution 205-*a*, threshold voltage distribution 205-*b*, threshold voltage distribution 205-*c*, and threshold voltage distribution 205-*d* while group 210-*b* can include logical levels associated with threshold voltage distribution 205-*c*, threshold voltage distribution 205-*f*, threshold voltage distribution 205-*g*, and threshold voltage 205-*h* and so forth—e.g., group 210-*c* can include threshold voltage distribution 205-*i* through 205-*l* and group 210-*d* can include threshold voltage distributions 205-*m* through group 210-*p*. It should be noted each group 210 can include any number of threshold voltage distributions 205 and that each group can include a different number of threshold voltages—e.g., a group 210 can include one (1), two (2), three (3), four (4), five (5), six (6), seven (7), eight (8), etc., threshold voltage distributions 205.

In some embodiments, the control logic can select or be programmed with a group verify voltage 215 for each group 210 selected. In some embodiments, the group verify voltage 215 can be a smallest (e.g., smallest by magnitude) verify voltage 215 utilized for a group. For example, the group verify voltage 215-*a*, group verify voltage 215-*b*, group voltage 215-*c*, and group voltage 215-*d* can be a verify voltage with a smallest magnitude for each respective group 210—e.g., group verify voltage 215-*b* can be a smallest verify voltage applied to group 210-*b* during a program verify operation. In at least one embodiment, the memory device can cause the group verify voltage 215 to be applied for at least each program verify operation associated with the respective group 210-*b*. For example, the memory device can cause the group verify voltage 215-*b* to be applied for each program verify operation associated with group 210-*b*. Additional details regarding applying the group verify voltage 215 for each program verify operation associated with group 210 is described with reference to FIGS. 3-5.

In some embodiments, the control logic can also store the number of program pulses remaining for a respective threshold voltage distribution 205 after a group verify voltage 215 is applied as described with reference to FIG. 3. Accordingly, the control logic of the memory device can perform program verify operations after storing a number of threshold voltage distributions, determining which threshold voltage distribution 205 is in a group 210, and information regarding the number of program pulses remaining.

Figure 3:
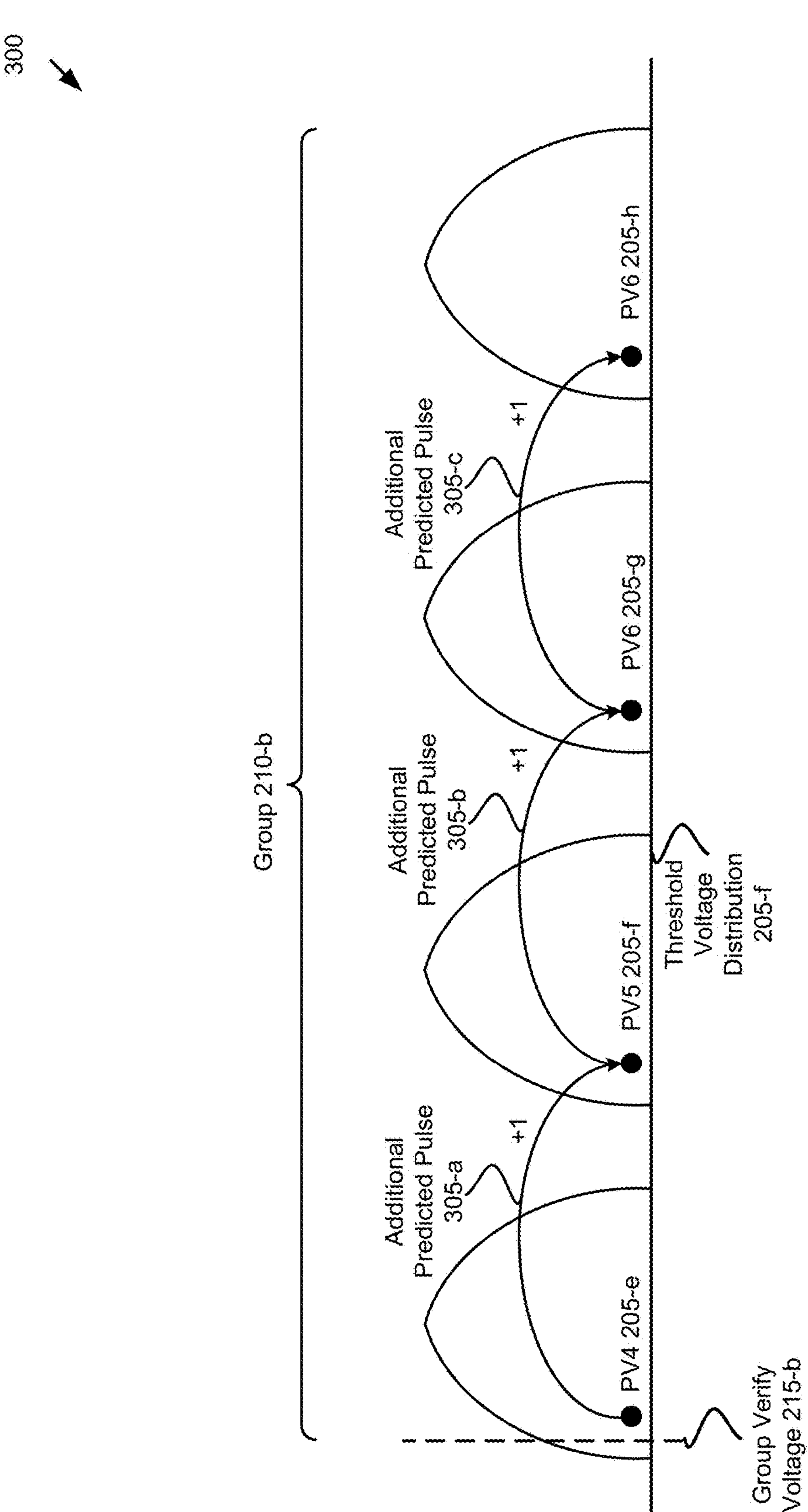
FIG. 3 is a diagram of a program verify operation using an arithmetic algorithm, in accordance with embodiments of the present disclosure.

FIG. 3 illustrates a diagram 300 for an improved predictive program verification operation, in accordance with some embodiments of the present disclosure. In one embodiment, diagram 300 can include group 210-*b* as described with reference to FIG. 2. It should be noted that diagram 300 can illustrate one possible grouping of logical levels and their respective threshold voltage distributions (e.g., distributions associated with a particular program verify (PV) voltage). It should be noted a number of threshold voltage distributions shown in diagram 300 are for illustrative purposes only and one example of many possible. That is, diagram 300 could illustrate any number of threshold voltage distributions (e.g., two (2), four (4), eight (8), sixteen (16), thirty-two (32), etc.) In some embodiments, diagram 300 can illustrate threshold voltage associated with a quadruple-level cell (QLC). In other embodiments, diagram 300 could illustrate threshold voltage distributions of multi-level cells (MLC), triple-level cells (TLC), penta-level cells (PLC), etc. In this embodiment, diagram 300 group 210-*b* having four (4) threshold voltage distributions 205-*c* through 205-*h*. In some embodiments, the group 210-*b* can include a group verify voltage 215-*b* as described with reference to FIG. 2.

In some embodiments, control logic of a memory device can determine the number of program pulses that still are to be applied to program memory cells to a respective logical level after a group verify voltage 215. For example, the control logic can determine the number of program pulses remaining (e.g., still to be applied) for each logical level after a group verify voltage 215-*b* is applied for the group 210-*b*. In one embodiment, the control logic can determine the number of program pulses remaining based on a programming sequence (e.g., a sequence indicating which programming voltages to apply to program all memory cells to respective logical states) stored on the memory device—e.g., based on a stored programming sequence that indicates the number of programming pulses applied in each program operation. In some embodiments, the programming sequence can also enable the control logic to determine that when memory cells are programmed to within a threshold voltage distribution 205 associated with a logical level—e.g., the control logic can determine that the memory cells are programmed within threshold voltage distribution 205 after an "n" number of program pulses are applied, where "n" is based on a logical level and the corresponding threshold voltage level. In some embodiments, the control logic is configured to store that information in a page buffer coupled with a bitline connected to the memory cells that are being programmed. For example, the control logic can cause a group verify voltage 215-*b* to be applied, and determine that based on the programming sequence that an additional predicted pulse 305-*a* should be applied to program a memory cell within threshold voltage distribution 205-*f*-. In some embodiments, the control logic can also determine that it takes one additional predicted pulse 305-*b* to program a memory cell to a logic level associated with threshold voltage distribution 205-*g* after programming a memory cell to threshold voltage distribution 205-*f*. In one embodiment, the control logic can determine that it takes an additional predicted pulse 305-*c* to program a memory cell to a logical level associated with threshold voltage distribution 205-*h* after programming a memory cell to threshold voltage distribution 205-*g*. Accordingly, the memory device can store the following information shown in Table 1:

grammed to a logical level associated with threshold voltage distribution 205-*a* after applying the group verify voltage 215-*b*. In some embodiments, the control logic can also decrement a count (e.g., the number of program pulses remaining associated with each respective threshold voltage distribution 205) after a programming pulse and subsequent group verify voltage is applied—e.g., after each time a programming pulse is applied following the application of the group verify voltage 215-*b*. In one embodiment, the control logic could cause a first programming pulse and a second group verify voltage 215-*b* to be applied after applying the group verify voltage 215-*b* and decrement each count of the respective logical level corresponding to the threshold voltage distributions by one (1). For example, decrement the count associated with a logical level associated with threshold voltage distribution 205-*f* to zero (0), decrement the count associated with a logical level associated with threshold voltage distribution 205-*g* to one (1), and decrement the count associated with a logical level associated with threshold voltage distribution 205-*h* to two (2)—e.g., change bits '01' to '00' for threshold voltage distribution 205-*f*, change bits '10' to '01' for threshold voltage distribution 205-*g*, and change bits '11' to '10' for threshold voltage distribution 205-*h*. The control logic can continue similar operations until memory cells that are intended to be programmed to threshold voltage distributions 205 in a group 210 are programmed—e.g., until memory cells are programmed to threshold voltage distribution 205-*h* for group 210-*b*. The control logic can use similar operations on the other groups—e.g., on groups 210-*a*, 210-*c*, and 210-*d* as described with reference to FIG. 1.

Figure 4:
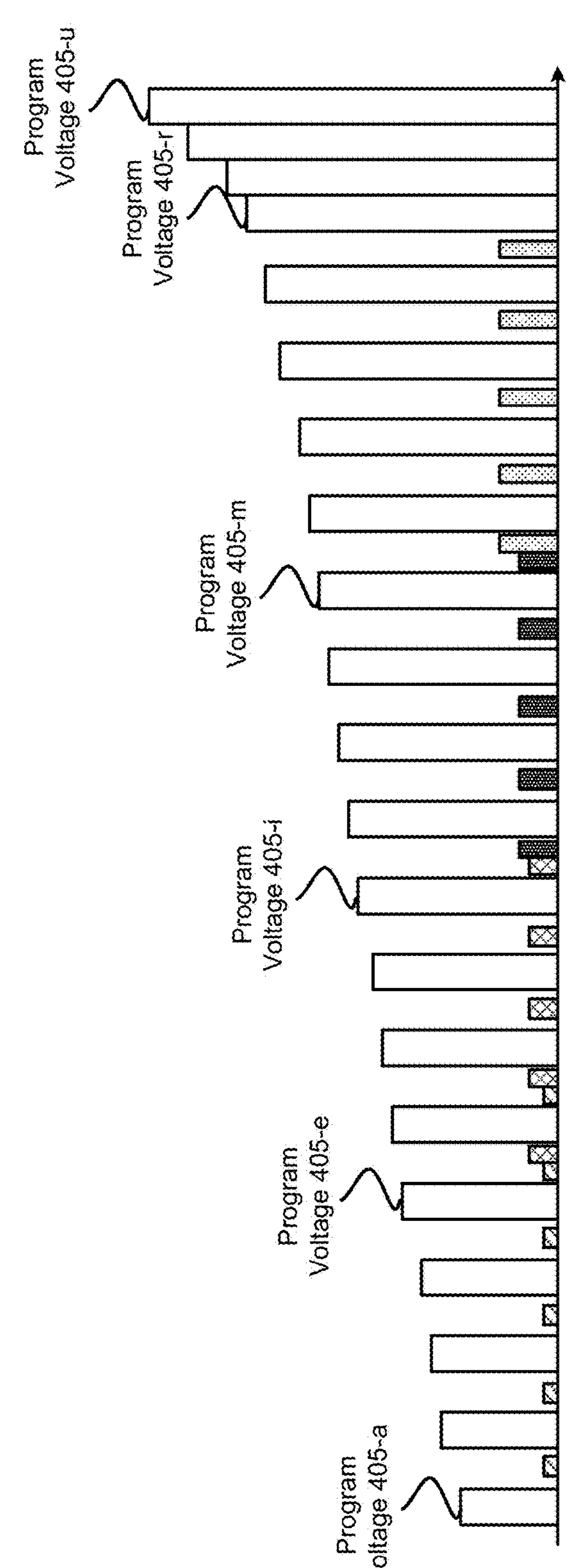
FIG. 4 is a diagram illustrating voltage applications during a program operation, in accordance with embodiments of the present disclosure.

FIG. 4 is a diagram 400 that illustrates application of programming pulses and program verify voltages, in accor-

TABLE 1

| Remaining Programming Pulses After Group Verify Voltage 215-b is Applied | | | |
|---|---|---|---|
| Threshold Voltage Distribution 205-e | Threshold Voltage Distribution 205-f | Threshold Voltage Distribution 205-g | Threshold Voltage Distribution 205-h |
| 0 | 1 | 2 | 3 |

In some embodiments, the control logic can store the information shown in Table 1 in a page buffer coupled with the bitline. In some embodiments, the control logic can store bits corresponding to the numbers shown in Table 1—e.g., store bit '00' corresponding to a number zero (0), store bit '01' corresponding to number one (1), store a bit '10' corresponding to a number two (2), and store bit '11' corresponding to a number three (3). It should be noted Table 1 illustrates one possible example, and other examples are possible. In other embodiments, a number of programming pulses remaining can be different—e.g., a number of programming pulses remaining for threshold voltage distributions 205-*f* through threshold voltage distribution 205-*h* can be greater than or equal to one (1), two (2), three (3), four (4), five (5), six (6), seven (7), eight (8), etc. Additionally, there can be any number of additional predicted pulses 305 between two threshold voltage distributions 205—e.g., there can be one (1), two (2), three (3), four (4), five (5), six (6), seven (7), eight (8), etc., programming pulses between two threshold voltage distributions In some embodiments, the control logic can stop programming of certain memory cells when a specified logical level is associated with a count zero (0)—e.g., stop apply additional programming pulses to memory cells to be prodance with some embodiments of the present disclosure. In one embodiment, the operations referenced by diagram 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the operations of diagram 400 are performed by local media controller 135 or program verify component 113 of FIG. 1A and FIG. 1B.

During a program operation performed on a non-volatile memory device, such as memory device 130, certain voltages can be applied to memory cells to increase their threshold charge—e.g., the program voltages 405 can be incrementally ramped up to increase a memory threshold voltage to a target voltage threshold. The program operation can include certain phases, including program, program recovery, program verify, and program verify recovery. Diagram 400 can also illustrate program verify voltages applied after a respective program voltage 405. As described with reference to FIGS. 2-3, the memory device can group threshold voltage distributions together and use one group verify voltage for the respective groups. Diagram 400 illustrates an example of four (4) program verify voltages 410 being applied—e.g., program verify voltage 410-*a*, program verify voltage 410-*b*, program verify voltage 410-*c*, and program verify voltage 410-*d*. In some embodiments, the four (4) program verify voltages 410 can correspond to four groups (e.g., groups 210 as described with reference to FIG. 2). It should be noted this only one example and any number of groups (and respective program verify voltages 410) are possible as described with reference to FIGS. 2 and 3. Additionally, diagram 400 illustrates an embodiment where 21 program voltages 405 are applied to program memory cell into one of sixteen (16) distributions. It should be noted any number of program pulses can be applied (e.g., any number of program pulses greater than 16 for the 16 distributions) and any number of voltage threshold distributions can exist—e.g., timing diagrams for MLC, TLC, and PLC memory cells can be different than diagram 400 illustrated.

In one embodiment, control logic of a memory device can cause an initial program voltage 405-*a* to be applied. In some embodiments, the control logic can then cause a first group verify voltage (e.g., program verify voltage 410-*a*) to be applied after the program voltage 405-*a*. In some embodiments, the control logic can also decrement a count associated with each respective logical level associated with threshold voltage distribution of a group associated with the program verify voltage 410-*a* as described with reference to FIG. 3. The control logic can continue applying slightly ramped (e.g., incrementally bigger) program voltages 405 and the program verify voltage 410-*a* after each subsequent program voltage 405 until all memory cells associated with the first group are programmed. In such embodiments, the control logic can cause a next group's program verify voltage 410 to be applied—e.g., the control logic can cause program verify voltage 410-*b* to be applied after programming memory cells to all logical levels associated with threshold voltage distributions of the first group. The control logic can continue to follow a similar operation until all program voltages 405-*u* are applied.

In at least one embodiment, the control logic can apply two or more program verify voltages 410 after a respective program voltage 405. For example, the control logic can cause program verify voltage 410-*a* and program verify voltage 410-*b* to be applied following program voltage 405-*c*. In at least one embodiment, the program verify voltage 410-*b* can ensure each memory cell of the first group is programmed—e.g., the program verify voltage 410-*b* can exceed a target voltage of each memory cell in the first group. Accordingly, the control logic can ensure the predicted number of program pulses were sufficient to program memory cells to a group of a logical levels. The control logic can similarly cause program verify voltage 410-*b* and program verify voltage 410-*c* to be applied after program voltage 405-*i* and cause program verify voltage 410-*c* and program verify voltage 410-*d* to be applied after program voltage 405-*m*. In some embodiments, the control logic can refrain from applying any program verify voltage after a respective program voltage. For example, the control logic can refrain from applying any program verify voltage 410 after applying program voltage 405-*r*. In some embodiments, a number of program verify voltages 410 applied after a respective program voltage can depend on a width of a voltage threshold distribution or a read window budget (RWB) of a memory device.

FIG. 5 is a flow diagram of an example method for implementing an improved program verify operation having an arithmetic algorithm, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by local media controller 135 or program verify component 113 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Before operation 505, a program operation can be initiated on a memory array. For example, processing logic (e.g., program verify component 113 of FIG. 1A) can initiate a program operation on the memory array, where the memory array includes memory cells programmable to one or more logical levels (e.g., programmable within one or more threshold voltage distributions 205 as described with reference to FIG. 2). In at least one embodiment, the program operation can include a program phase, a program recovery phase, a program verify phase, and a program verify recovery phase. In at least one embodiment, the memory cells are quad-level cells (QLC) with sixteen (16) threshold voltage distributions.

At operation 505, a program voltage is applied to a subset of a plurality of memory cells to be programmed to a specified logical level during a program operation. For example, the processing logic can cause a program voltage to be applied to a subset of the plurality of memory cells to be programmed to a specified logical level during a program operation, where the specified logical level is associated with a group of logical levels. For example, processing logic can cause program voltage 405-*a* to be applied to program a memory cell to a first logical level (e.g., a logical level associated with threshold voltage distribution 205-*a*). In some embodiments, the processing logic can ramp up the programming voltage throughout the program operation—e.g., incrementally increase the programming voltage throughout the program operation as described with reference to FIG. 4. For example, the processing logic can cause a second program voltage to be applied to memory cells to be programmed to a second specified logical level of the group of logical levels. In such examples, the second program voltage can be greater than the program voltage. As described with reference to FIG. 2, the control logic can select groups of logical levels and apply a single program verify voltage to program memory cells to each logical level of the group of logical levels—e.g., create groups 210-*a* through 210-*d*. In some embodiments, the control logic can select the groups based on a program voltage step (e.g., Vpgm step), memory array size, a number of bits stored by the memory cell, the number of program pulses applied, a read window budget (RWB), etc.

At operation 510, a first program verify voltage associated with the group of logical levels is applied to the subset of memory cells. For example, processing logic can a first program verify voltage associated with the group of logical levels to be applied to the subset of memory cells—e.g., cause group verify voltage 215-*a* to be applied as described with reference to FIG. 2. As described with reference to FIG. 2, the processing logic can apply the same first program verify voltage for each logical level of the group of logical levels. Accordingly, the processing logic can cause the first program verify voltage associated with the first group of logical levels to be applied to the memory cells responsive to causing the second program voltage to be applied. In some embodiments, the processing logic can continue to apply the first program verify voltage until all memory cells to be programmed to the first group of logical levels are programmed to the first group of logical levels. In such embodiments, the processing logic can then apply a second program verify voltage associated with a second group of logical levels—e.g., apply group verify voltage 215-*b* for group 210-*b* as described with reference to FIGS. 2 and 3.

At operation 515, responsive to applying the first program verify voltage, a count a count associated with the specified logical level is decremented. For example, processing logic can decrement a count a count associated with the specified logical level, where the count indicates a number of remaining program voltages to be applied for programming the subset of memory cells to the specified logical level of the predefined group of logical levels. In at least one embodiment, the count indicates a number of remaining program voltages to be applied before memory cells are programmed to the respective logical level—e.g., the count can refer to a number of programming pulses still to be applied to a memory cell to program the memory cell to a respective logical level as described with reference to FIG. 3. The processing logic can also decrement a count associated with a respective logical level of the first group of threshold logical level responsive to applying the first program verify voltage. In at least one embodiment, the count associated with each respective logical level of the first group of logical level is stored in a page buffer coupled to the bitline connected to the subset of memory cells. In some embodiments, the processing logic can decrement the count associated with the second threshold logical level of the first group of logical levels responsive to applying the first program verify voltage—e.g., where the count indicates a number of remaining program voltages to be applied before memory cells are programmed to the second logical level.

At operation 520, responsive to determining that the count falls below a threshold value, the program operation for the subset of plurality of memory cells is terminated. For example, processing logic can determine that the count satisfies a threshold value responsive to decrementing the count. For example, the processing logic can determine that the count is at zero (0) as described with reference to FIG. 3. In some embodiments, the processing logic can determine that the count fails to satisfy the threshold value—e.g., that the count is greater than zero (0). In such embodiments, the processing logic can continue programming memory cells associated with the respective logical level—e.g., continue applying program voltages to memory cells to be programmed to a logical level associated with the respective threshold voltage distribution. For example, the processing logic can cause a second program voltage to be applied to a second subset of the plurality of memory cells to be programmed to a second specified logical level during the program operation, where the second specified logical level is associated with a second group of logical levels. The processing logic can then cause a second program verify voltage associated with the second group of logical levels to be applied to the second subset of the plurality of memory cells. In at least one embodiment, responsive to applying the second program verify voltage, the processing logic can decrement a second count associated with the second specified level, wherein the second count indicates a second number of remaining program voltages to be applied to the second subset of memory cells to the second specified logical level of the second group of logical levels. In some embodiments, responsive to determining that the count exceeds a second threshold value, the processing logic can continue the program operation for the second subset of the plurality of memory cells. In one embodiment, processing logic can terminate the program operation for the subset of memory cells responsive to determining the count satisfies the threshold value—e.g., the processing logic can inhibit further programing of the subset of memory cells. In some embodiments, the processing logic can predict the memory cells are programmed to the respective logical level based on the count being zero rather than ramping the program verify voltage and comparing a current threshold voltage to a target threshold voltage.

In some embodiments, each respective logical level is associated with a different program verify level and the first program verify voltage associated with the first group has a smallest magnitude of the different program verify levels. That is, as described with reference to FIG. 2, each logical level associated with a corresponding threshold voltage distribution can have one or more different associated program verify levels. But for each group 210, a lowest program verify level voltage is selected—e.g., group 210-*b* has a group verify voltage 210-*b* that is lower than what a program verify level associated with the remaining logical levels would be. In at least one embodiment, there at least two or more groups of logical level—e.g., there can be two (2) groups, three (3) groups, four (4) groups, five (5) groups, six (6) groups, seven (7) groups, eight (8) groups, etc. In some embodiments, a second group of logical levels is associated with a second program verify voltage greater than the first program verify voltage—e.g., group verify voltage 215-*d* can be greater than group verify voltage 215-*c*, which can be greater than group verify voltage 215-*b*, which can be greater than group verify voltage 215-*a*. In some embodiments, a gap between the first program verify voltage and a second program verify voltage is based on a step between two or more programming voltages—e.g., a gap between group verify voltage 215-*a* and group verify voltage 215-*b* can be based on a step between a programming voltage associated with group 210-*a* and a programming voltage associated with group 210-*b*. Alternatively, as the groups can be selected based on a program voltage step, the group verify voltage selected can also be based on the program voltage step. In at least one embodiment, processing logic can decrement a count associated with each of the logical levels responsive to causing the first program verify voltage to be applied. In at least one embodiment, a number of logical levels in the group of logical levels is equal to a number of logical levels in the second group of logical levels.

In at least one embodiment, the processing logic can a second program voltage to be applied to a second subset of the plurality of memory cells to be programmed to a second specified logical level, where the second logical level is associated with the group of logical levels. In such embodiments, the processing logic can cause the first program verify voltage associated with the group of logical levels to be applied to the second subset of the plurality of memory cells. Additionally, the processing logic can, responsive to applying the first program verify voltage, decrement a second count associated with the second specified logical level, where the second count indicates a number of remaining program voltages to be applied for programming the second subset of memory cells to the second specified logical of the predefined group of logical levels. In one embodiment, the processing logic can, responsive to determining that the count falls below a second threshold value, terminate the program operation for the second subset of the plurality of memory cells.

Figure 6:
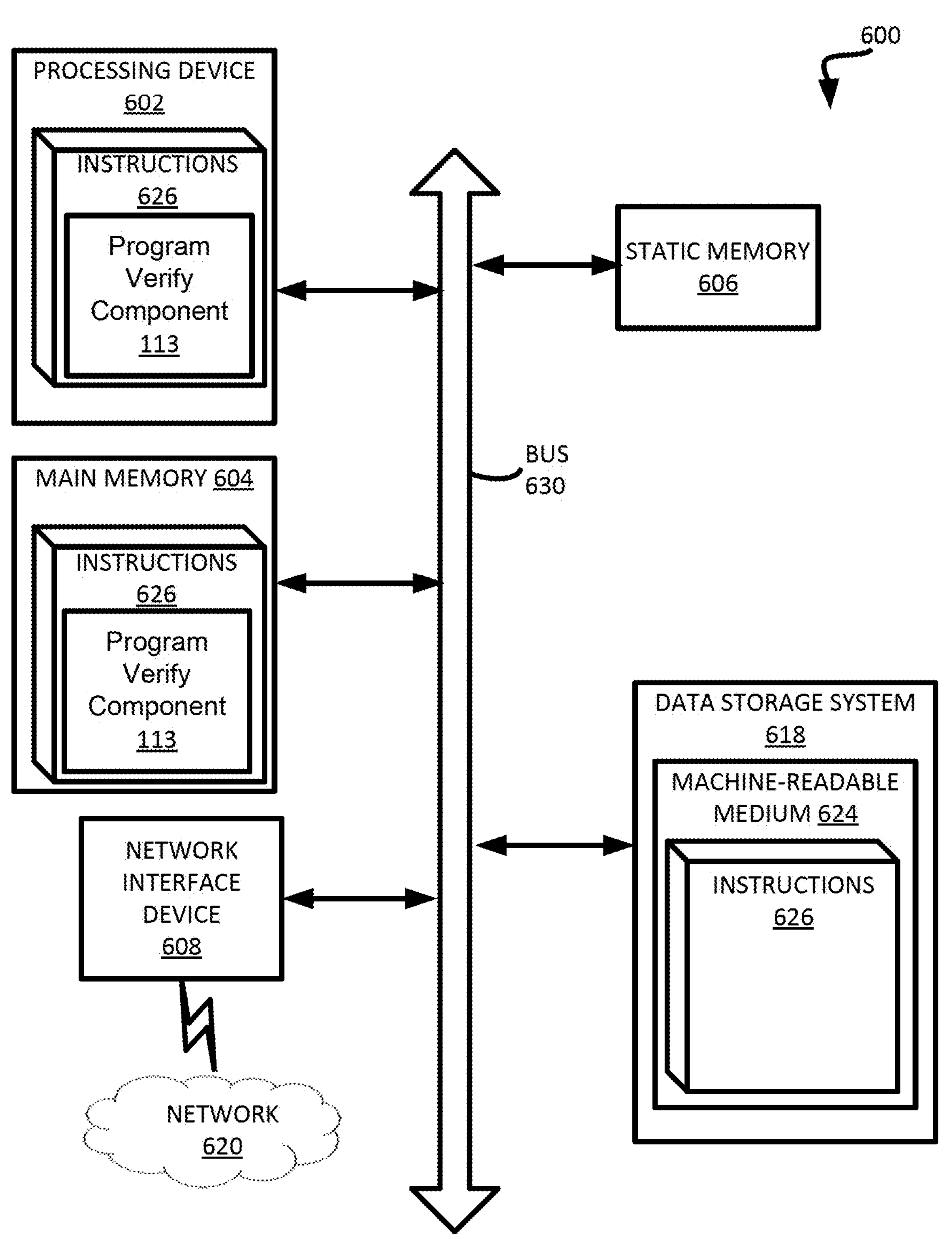
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the program verify component 113 of FIG. 1 to perform operations). In one embodiment, the program verify component 113 is configured to track a number of voltage threshold distribution groups. For example, the program verify component 113 can store a number of programming pulses remaining for each respective voltage threshold distribution after a respective group verify level is applied. The program verify component 113 can then decrement the number (e.g., a count) associated with each respective voltage threshold distribution group and inhibit programming of memory cells that are programmed to a voltage threshold distribution associated with a count zero (0) as described with reference to FIGS. 1-5. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 404 can correspond to the memory sub-system 110 of FIG. 1.

In one embodiment, the instructions 626 include instructions to implement functionality corresponding to voltage application component 113 to perform a program operation for the processing device 602. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD- ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:

a memory array comprising a plurality of memory cells; and control logic, operatively coupled with the memory array, to perform operations comprising:

causing a program voltage to be applied to a subset of the plurality of memory cells to be programmed to a specified logical level during a program operation, wherein the specified logical level is associated with a predefined group of logical levels, wherein each respective logical level is associated with a corresponding program verify voltage of a plurality of program verify voltages, and wherein a first program verify voltage associated with the group of logical levels has a smallest magnitude among the plurality of program verify voltages;

causing the first program verify voltage associated with the group of logical levels to be applied to the subset of memory cells;

responsive to applying the first program verify voltage, decrementing a count associated with the specified logical level, wherein the count indicates a number of remaining program voltages to be applied for programming the subset of memory cells to the specified logical level of the predefined group of logical levels; and responsive to determining that the count falls below a threshold value, terminating the program operation for the subset of the plurality of memory cells.

2. The memory device of claim 1, wherein the operations further comprise:

causing a second program voltage to be applied to a second subset of the plurality of memory cells to be programmed to a second specified logical level, wherein the second specified logical level is associated with the group of logical levels;

causing the first program verify voltage associated with the group of logical levels to be applied to the second subset of the plurality of memory cells;

responsive to applying the first program verify voltage, decrementing a second count associated with the second specified logical level, wherein the second count indicates a number of remaining program voltages to be applied for programming the second subset of memory cells to the second specified logical level of the predefined group of logical levels; and responsive to determining that the second count falls below a second threshold value, terminating the program operation for the second subset of the plurality of memory cells.

3. The memory device of claim 1, wherein the count associated with the specified logical level is stored in a page buffer coupled to a bitline connected to the subset of memory cells.

4. The memory device of claim 1, wherein the operations comprise:

decrement a count associated with each of the logical levels of the predefined group of logical levels responsive to causing the first program verify voltage to be applied.

5. The memory device of claim 1, wherein the operations further comprise:

causing a second program voltage to be applied to a second subset of the plurality of memory cells to be programmed to a second specified logical level during the program operation, wherein the second specified logical level is associated with a second group of logical levels;

causing a second program verify voltage associated with the second group of logical levels to be applied to the second subset of the plurality of memory cells;

responsive to applying the second program verify voltage, decrementing a second count associated with the second specified logical level, wherein the second count indicates a second number of remaining program voltages to be applied to the second subset of memory cells to the second specified logical level of the second group of logical levels; and responsive to determining that the second count exceeds a second threshold value, continuing the program operation for the second subset of the plurality of memory cells.

6. The memory device of claim 5, wherein a number of logical levels in the group of logical levels is equal to a number of logical levels in the second group of logical levels.

7. The memory device of claim 1, wherein the memory cells are quad-level cells (QLC).

8. A method, comprising:

causing a program voltage to be applied to a subset of a plurality of memory cells to be programmed to a specified logical level during a program operation, wherein the specified logical level is associated with a predefined group of logical levels, wherein each respective logical level is associated with a corresponding program verify voltage of a plurality of program verify voltages, and wherein a first program verify voltage associated with the group of logical levels has a smallest magnitude among the plurality of program verify voltages;

causing the first program verify voltage associated with the group of logical levels to be applied to the subset of memory cells; and responsive to applying the first program verify voltage, decrementing a count associated with the specified logical level, wherein the count indicates a number of remaining program voltages to be applied for programming the subset of memory cells to the specified logical level of the predefined group of logical levels; and responsive to determining that the count falls below a threshold value, terminating the program operation for the subset of the plurality of memory cells.

9. The method of claim 8, further comprising:

causing a second program voltage to be applied to a second subset of the plurality of memory cells to be programmed to a second specified logical level, wherein the second specified logical level is associated with the group of logical levels;

causing the first program verify voltage associated with the group of logical levels to be applied to the second subset of the plurality of memory cells;

responsive to applying the first program verify voltage, decrementing a second count associated with the second specified logical level, wherein the second count indicates a number of remaining program voltages to be applied for programming the second subset of memory cells to the second specified logical level of the predefined group of logical levels; and responsive to determining that the second count falls below a second threshold value, terminating the program operation for the second subset of the plurality of memory cells.

10. The method of claim 8, wherein the count associated with the specified logical level is stored in a page buffer coupled to a bitline connected to the subset of memory cells.

11. The method of claim 8, further comprising:

decrementing a count associated with each of the logical levels of the predefined group of logical levels responsive to causing the first program verify voltage to be applied.

12. The method of claim 8, further comprising:

causing a second program voltage to be applied to a second subset of the plurality of memory cells to be programmed to a second specified logical level during the program operation, wherein the second specified logical level is associated with a second group of logical levels;

causing a second program verify voltage associated with the second group of logical levels to be applied to the second subset of the plurality of memory cells;

responsive to applying the second program verify voltage, decrementing a second count associated with the second specified logical level, wherein the second count indicates a second number of remaining program voltages to be applied to the second subset of memory cells to the second specified logical level of the second group of logical levels;

responsive to determining that the second count exceeds a second threshold value, continuing the program operation for the second subset of the plurality of memory cells.

13. The method of claim 12, wherein a number of logical levels in the group of logical levels is equal to a number of logical levels in the second group of logical levels.

14. The method of claim 8, wherein the memory cells are quad-level cells (QLC).

15. A non-transitory computer-readable medium comprising executable instructions which when executed by a processing device, cause the processing device to:

cause a program voltage to be applied to a subset of a plurality of memory cells to be programmed to a specified logical level during a program operation, wherein the specified logical level is associated with a predefined group of logical levels, wherein each respective logical level is associated with a corresponding program verify voltage of a plurality of program verify voltages, and wherein a first program verify voltage associated with the group of logical levels has a smallest magnitude among the plurality of program verify voltages;

cause the first program verify voltage associated with the group of logical levels to be applied to the subset of memory cells; and responsive to applying the first program verify voltage, decrement a count associated with the specified logical level, wherein the count indicates a number of remaining program voltages to be applied for programming the subset of memory cells to the specified logical level of the predefined group of logical levels; and responsive to determining that the count falls below a threshold value, terminate the program operation for the subset of the plurality of memory cells.

16. The non-transitory computer-readable medium of claim 15, further comprising executable instructions which when executed by the processing device, cause the processing device to:

cause a second program voltage to be applied to a second subset of the plurality of memory cells to be programmed to a second specified logical level, wherein the second specified logical level is associated with the group of logical levels;

cause the first program verify voltage associated with the group of logical levels to be applied to the second subset of the plurality of memory cells;

responsive to applying the first program verify voltage, decrement a second count associated with the second specified logical level, wherein the second count indicates a number of remaining program voltages to be applied for programming the second subset of memory cells to the second specified logical level of the predefined group of logical levels; and responsive to determining that the second count falls below a second threshold value, terminate the program operation for the second subset of the plurality of memory cells.

17. The non-transitory computer-readable medium of claim 15, wherein the count associated with the specified logical level is stored in a page buffer coupled to a bitline connected to the subset of memory cells.

* * * * *